United States Patent
Osada

(10) Patent No.: US 8,796,375 B2
(45) Date of Patent: Aug. 5, 2014

(54) PREPREG, METAL-CLAD LAMINATE, PRINTED WIRING BOARD, AND SEMICONDUCTOR DEVICE

(71) Applicant: Shin-Etsu Chemical Co., Ltd., Tokyo (JP)

(72) Inventor: Shoichi Osada, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 138 days.

(21) Appl. No.: 13/646,266

(22) Filed: Oct. 5, 2012

(65) Prior Publication Data

US 2013/0088842 A1     Apr. 11, 2013

(30) Foreign Application Priority Data

Oct. 7, 2011   (JP) .................................. 2011-222598

(51) Int. Cl.
*C08K 3/22* (2006.01)
*B32B 15/08* (2006.01)
*C08K 7/14* (2006.01)
*C08L 63/00* (2006.01)

(52) U.S. Cl.
CPC . *B32B 15/08* (2013.01); *C08K 3/22* (2013.01); *C08K 7/14* (2013.01); *C08L 63/00* (2013.01)
USPC ........... 524/430; 361/783; 428/471; 524/403; 174/255

(58) Field of Classification Search
CPC ............ B32B 15/08; C08K 3/22; C08K 7/14; C08L 63/00
USPC ......................................................... 524/430
See application file for complete search history.

(56) References Cited

U.S. PATENT DOCUMENTS

2006/0025501 A1 *   2/2006   Osada et al. .................. 523/457

FOREIGN PATENT DOCUMENTS

JP          2009-059962 A       3/2009

OTHER PUBLICATIONS

Abe, "Reliability and Sealing Materials of Cu Wire Package," The 12th IC Packaging Technology Expo (ICP 2011), Seminar Documents, with English translation (2011).
Uno, T. and T. Yamada, "Improving Humidity Bond Reliability of Copper Bonding Wires," 2010 Electronic Components and Technology Conference, pp. 1729-1732 (2010).

* cited by examiner

*Primary Examiner* — Doris Lee
(74) *Attorney, Agent, or Firm* — Birch, Stewart, Kolasch & Birch, LLP

(57) ABSTRACT

A prepreg that yields a semiconductor device which, even when using Cu wire, exhibits excellent reliability under conditions of high temperature and high humidity (heat-resistant and moisture-resistant reliability), a metal-clad laminate and a printed wiring board that use the prepreg, and a semiconductor device that uses the printed wiring board. Specifically disclosed are a prepreg comprising a substrate and a B-staged resin composition comprising (a) a thermosetting resin, (b) a hydrotalcite compound having a specific composition, (c) zinc molybdate, and (d) lanthanum oxide.

4 Claims, No Drawings

PREPREG, METAL-CLAD LAMINATE, PRINTED WIRING BOARD, AND SEMICONDUCTOR DEVICE

BACKGROUND OF THE INVENTION

1. Field of the Invention

The present invention relates to a prepreg, a laminate, a printed wiring board, and a semiconductor device that uses these elements. The laminate of the present invention includes a laminate in which one surface or both surfaces are coated with a metal foil, namely a metal-clad laminate.

2. Description of the Prior Art

In recent years, the amounts of prepregs used for electrical insulation, laminates and printed wiring boards have increased as semiconductor devices have been reduced in size and weight and improved in terms of functionality. Conventionally, the terminals on semiconductor elements and the circuits on printed wiring boards have been connected with Au wire, Au bumps or solder balls, but recently the use of Cu wire has been increasing, with the aim of reducing cost.

However, there have been reports that when Cu wire is used in a bias test under conditions of high temperature and high humidity (HAST), occurrences of open failure may occur at the junctions between the Cu wire and Al pads on the semiconductor element.

DOCUMENTS OF RELATED ART

Non-Patent Documents

[Non-Patent Document 1] 2010 Electronic Components and Technology Conference, 1729 to 1732
[Non-Patent Document 2] The 12th IC Packaging Technology Expo (ICP 2011), seminar documents, title: "Reliability of Copper Wire Packages and Molding Compounds"

Patent Documents

[Patent Document 1] JP 2009-59962 A

It is thought that anionic impurities contained within semiconductor devices cause corrosion of Al or Cu/Al intermetallic compounds, and an effect caused by halogen-free flame retardants in semiconductor encapsulating materials has been reported.

SUMMARY OF THE INVENTION

The present invention has been developed in light of the above circumstances, and has an object of providing a prepreg that yields a semiconductor device which, even when using Cu wire, exhibits excellent reliability under conditions of high temperature and high humidity (heat-resistant and moisture-resistant reliability), a metal-clad laminate and a printed wiring board that use the prepreg, and a semiconductor device that uses the printed wiring board.

As a result of intensive investigation aimed at achieving the above object, the inventors of the present invention discovered that by reducing the amount of ionic impurities within a printed wiring board used in a semiconductor device, and appropriately controlling the pH of a water extract from the printed wiring board, electrical failures under conditions of high temperature and high humidity could be reduced regardless of the type of encapsulating resin used, and they were therefore able to complete the present invention.

In other words, a first aspect of the present invention provides a prepreg comprising a substrate and a B-staged (namely, semi-cured) resin composition comprising:
(a) 100 parts by mass of a thermosetting resin,
(b) 1 to 5 parts by mass of a hydrotalcite compound represented by formula (I) shown below:

$$Mg_xAl_y(OH)_{2x+3y-2z}(CO_3)_z \cdot mH_2O \tag{1}$$

wherein x and y are positive numbers, and z represents 0 or a positive number, provided that x, y and z satisfy $0 < y/x \le 1$ and $0 \le z/y < 1.5$, and m represents a positive number,
(c) at least 0.5 parts by mass of zinc molybdate, and
(d) 0.2 to 1 part by mass of lanthanum oxide,
wherein the resin composition is impregnated into the substrate.

A second aspect of the present invention provides a metal-clad laminate comprising:
one layer of, or a plurality of laminated layers of, the above prepreg, and
a metal foil provided on one surface or both surfaces of the prepreg.

A third aspect of the present invention provides a printed wiring board comprising:
one layer of, or a plurality of laminated layers of, the above prepreg, and
a wiring pattern composed of a metal foil provided on one surface or both surfaces of the prepreg.

A fourth aspect of the present invention provides a semiconductor device comprising:
the printed wiring board described above,
a semiconductor element mounted on the printed wiring board, and
Cu wire that electrically connects the wiring pattern of the printed wiring board and the semiconductor element.

The hydrotalcite compound of the component (b) exhibits excellent pH control and excellent trapping of chloride ions, organic acid ions, sulfate ions and nitrate ions, the zinc molybdate of the component (c) exhibits excellent trapping of sulfate ions, and the lanthanum oxide of the component (d) exhibits excellent trapping of sulfate ions and phosphate ions. Because the prepreg of the present invention comprises these components, anionic impurities in a semiconductor device of the present invention that uses the prepreg are trapped effectively under conditions of high temperature and high humidity, meaning that even when Cu wiring is used, electrical failures are unlikely. Accordingly, the prepreg of the present invention is ideal for electrical insulation. By using the prepreg of the present invention, inexpensive Cu wire can be used in semiconductor devices, and therefore resources such as Au wire can be conserved, and costs can be reduced.

DESCRIPTION OF THE EMBODIMENTS

(a) Thermosetting Resin

Examples of resins that may be used as the thermosetting resin of the component (a) include thermosetting resins containing epoxy groups, maleimide groups, or both of these groups, such as epoxy resins and bismaleimide compounds. A single compound may be used alone as the component (a), or a combination of two or more compounds may be used.

Examples of epoxy resins that may be used include bisphenol A epoxy resins, bisphenol F epoxy resins, bisphenol S epoxy resins, biphenyl epoxy resins, naphthalenediol epoxy resins, phenol novolac epoxy resins, cresol novolac epoxy resins, phenol aralkyl epoxy resins, biphenyl aralkyl epoxy resins, triphenolmethane epoxy resins, aliphatic epoxy resins, tetrakis(glycidyloxyphenyl)ethane, glycidyl ester resins, glycidyl amine resins, heterocyclic epoxy resins (such as triglycidyl isocyanurate and diglycidyl hydantoin), and modified epoxy resins obtained by modifying any of the above epoxy resins with one or more types of reactive monomer. A single epoxy resin may be used alone, or a combination of two or more epoxy resins may be used.

There are no particular limitations on the bismaleimide compounds, and representative examples include bis(3-methyl-4-maleimidophenyl)methane, bis(3-ethyl-4-maleimidophenyl)methane, bis(3,5-dimethyl-4-maleimidophenyl)methane, bis(3-ethyl-5-methyl-4-maleimidophenyl)methane, bis(3,5-diethyl-4-maleimidophenyl)methane, prepolymers of these bismaleimide compounds, and prepolymers formed from one or more of these bismaleimide compounds and an amine compound. A single bismaleimide compound may be used alone, or a combination of two or more compounds may be used.

In order to semi-cure or cure the resin composition comprising the thermosetting resin of the component (a), a curing agent is typically added to the resin composition. There are no particular limitations on the curing agent, which may be any compound used as a curing agent for thermosetting resins, and examples include compounds used as curing accelerators for epoxy resins, bismaleimide compounds, or both these types of compounds. Specific examples include amine-based curing agents, phenol-based curing agents, acid anhydride-based curing agents, and cyanate ester compounds. Among these, the types of compounds typically used for electrically insulating varnishes are preferred. A single curing agent may be used alone, or a combination of two or more curing agents may be used.

Amine-based curing agents are typically used as curing accelerators for epoxy resins. Specific examples of amine-based curing agents that may be used include chain-like aliphatic amines such as ethylenediamine, diethylenetriamine, triethylenetetramine, tetraethylenepentamine, hexamethylenediamine, diethylaminopropylamine, dicyandiamide, tetramethylguanidine and triethanolamine; cyclic aliphatic amines such as isophoronediamine, diaminodicyclohexylmethane, bis(aminomethyl)cyclohexane, bis(4-amino-3-methyl dicyclohexyl)methane, N-aminoethylpiperazine and 3,9-bis(3-aminopropyl)-2,4,8,10-tetraoxaspiro[5.5]undecane; and aromatic amines such as xylenediamine, phenylenediamine, diaminodiphenylmethane and diaminodiphenylsulfone. Among these, dicyandiamide is preferred in terms of the curing properties of the curing agent and the physical properties of the resulting cured product. A single amine-based curing agent may be used alone, or a combination of two or more amine-based curing agents may be used. The amount added of the amine-based curing agent is set so that the number of mols of nitrogen atoms within the amine-based curing agent per 1 mol of epoxy groups within the thermosetting resin of the component (a) is preferably within a range from 0.1 to 1.0 mols, and more preferably from 0.3 to 0.6 mols.

Phenol-based curing agents are typically used as curing accelerators for epoxy resins. Specific examples of phenol-based curing agents include biphenol, bisphenol A, bisphenol F, phenol novolac, cresol novolac, bisphenol A novolac, phenol aralkyl, biphenyl aralkyl, and alkyl group-substituted versions of the above compounds (wherein examples of the alkyl group include a methyl group and an ethyl group). A single phenol-based curing agent may be used alone, or a combination of two or more phenol-based curing agents may be used. The amount added of the phenol-based curing agent is set so that the number of mols of phenolic hydroxyl groups within the phenol-based curing agent per 1 mol of epoxy groups within the thermosetting resin of the component (a) is preferably within a range from 0.5 to 2.0 mols, and more preferably from 0.7 to 1.5 mols.

Acid anhydride-based curing agents are typically used as curing accelerators for epoxy resins. Specific examples of acid anhydride-based curing agents include hexahydrophthalic anhydride (HPA), tetrahydrophthalic anhydride (THPA), pyromellitic anhydride (PMDA), chlorendic anhydride (HET), nadic anhydride (NA), methyl nadic anhydride (MNA), dodecenylsuccinic anhydride (DDSA), phthalic anhydride (PA), methylhexahydrophthalic anhydride (MeHPA) and maleic anhydride. A single acid anhydride-based curing agent may be used alone, or a combination of two or more acid anhydride-based curing agents may be used. The amount added of the acid anhydride-based curing agent is set so that the number of mols of acid anhydride groups within the acid anhydride-based curing agent per 1 mol of epoxy groups within the thermosetting resin of the component (a) is preferably within a range from 0.5 to 2.0 mols, and more preferably from 0.6 to 1.0 mols.

Cyanate ester compounds are typically used as curing accelerators for bismaleimide compounds. There are no particular limitations on the cyanate ester compound, provided it is a cyanate ester compound containing two or more cyanate groups within each molecule. Specific examples of such cyanate ester compounds include 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-dicyanatophenyl)methane, 2,2-bis(4-cyanatophenyl)propane, bis(4-cyanatophenyl)ether, bis(4-cyanatophenyl) thioether, bis(4-cyanatophenyl)sulfone, and cyanate ester compounds obtained by reacting a novolac with a halogenated cyanide. Further, prepolymers having a weight-average molecular weight of 500 to 5,000 and containing a triazine ring, formed by trimerizing the cyanate group of one of these cyanate ester compounds (cyanate ester monomers), can be used particularly favorably. These prepolymers are obtained by polymerizing the cyanate ester monomers mentioned above, using an acid such as a mineral acid or a Lewis acid, a base such as a sodium alcoholate or a tertiary amine, or a salt such as sodium carbonate as a catalyst. A single cyanate ester compound may be used alone, or a combination of two or more cyanate ester compounds may be used. The amount added of the cyanate ester compound is set so that the number of mols of cyanate groups within the cyanate ester compound per 1 mol of maleimide groups within the thermosetting resin of the component (a) is preferably within a range from 0.1 to 1.0 mols, and more preferably from 0.3 to 0.6 mols.

(b) Hydrotalcite Compound

The component (b) is a hydrotalcite compound represented by formula (I) shown below:

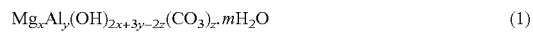

$$Mg_xAl_y(OH)_{2x+3y-2z}(CO_3)_z \cdot mH_2O \tag{1}$$

wherein x and y are positive numbers, and z represents 0 or a positive number, provided that x, y and z satisfy $0<y/x\leq 1$ and $0\leq z/y<1.5$, and m represents a positive number.

x is preferably a positive number of 2 to 5. y is preferably a positive number of 1 to 3. z is preferably a number of 0 to 2. Moreover, x, y and z preferably satisfy $0.4\leq y/x\leq 0.8$ and $0\leq z/y<0.5$. m is preferably a positive number of 1 to 4. A single compound may be used alone as the component (b), or a combination of two or more compounds may be used.

The amount added of the hydrotalcite compound of the component (b) is within a range from 1 to 5 parts by mass, and preferably from 1 to 3 parts by mass, per 100 parts by mass of the thermosetting resin. If the amount added is less than 1 part by mass, then a satisfactory pH control capability and impurity-trapping capability are unobtainable. If the amount added exceeds 5 parts by mass, then the pH control capability, the impurity-trapping capability, or both these capabilities become excessive, and the amount of moisture absorbed by the hydrotalcite compound itself increases, causing a deterioration in the moisture-resistant reflow characteristics of the obtained semiconductor device.

(c) Zinc Molybdate

The amount added of the zinc molybdate of the component (c) is at least 0.5 parts by mass, and preferably at least 3 parts by mass, per 100 parts by mass of the thermosetting resin of the component (a). If the amount added is less than 0.5 parts by mass, then a satisfactory impurity-trapping capability is unobtainable. Although there are no particular limitations on the upper limit for the amount added, from the viewpoint of making it easier to maintain the adhesiveness and workability of a laminate and a printed wiring board produced using the obtained resin composition, the upper limit is preferably an amount equivalent to 5 to 50% by mass of the entire resin composition. For example, this upper limit is preferably 100 parts by mass, and more preferably 50 parts by mass, per 100 parts by mass of the thermosetting resin of the component (a).

(d) Lanthanum Oxide

The amount added of the lanthanum oxide of the component (d) is within a range from 0.2 to 1 part by mass, and preferably from 0.3 to 0.6 parts by mass, per 100 parts by mass of the thermosetting resin. If the amount added is less than 0.2 parts by mass, then a satisfactory impurity-trapping capability is unobtainable. If the amount added exceeds 1 part by mass, then the amount of moisture absorbed by the lanthanum oxide itself increases, causing a deterioration in the moisture-resistant reflow characteristics of the obtained semiconductor device.

[Other Components]

The resin composition used in the present invention may also contain an inorganic filler, which is added for the purposes of further enhancing the flame retardancy, improving the rigidity, and reducing thermal expansion of a prepreg produced from the resin composition. From the viewpoint of facilitating achievement of the above purposes, and from the viewpoint of making it easier to maintain the adhesiveness and workability of a laminate and a printed wiring board produced using the resin composition, the amount of the inorganic filler preferably represents 10 to 50% by mass of all the components within the resin composition excluding any organic solvents, namely 10 to 50% by mass of the total solid fraction of the resin composition including the inorganic filler. There are no particular limitations on the inorganic filler, provided it does not impair the properties of the laminate and the printed wiring board, and specific examples include silica, talc, mica, aluminum oxide, magnesium carbonate and barium carbonate. A single inorganic filler may be used alone, or a combination of two or more inorganic fillers may be used.

Besides the inorganic filler, other components such as flame retardants, pigments, adhesion assistants, antioxidants, curing accelerators and organic solvents may also be added to the resin composition used in the present invention without any particular limitations, provided they do not impair the properties of the laminate and the printed wiring board. These other components may be used alone, or a combination of two or more components may be used. Conventional compounds can be used as these other components, and for example, imidazoles such as 2-ethyl-4-methylimidazole can be used as curing accelerators. There are no particular limitations on the amounts added of these other components, provided they do not impair the properties of the laminate and the printed wiring board.

There are no particular limitations on the type or amount of organic solvent used, provided the solvent is capable of uniformly dissolving the resin composition, and is able to maintain appropriate levels of viscosity and volatility for preparing the prepreg. Among the various possibilities, from the viewpoint of satisfying the above conditions, and from the viewpoints of cost, handling properties and safety, preferred organic solvents include acetone, methyl ethyl ketone, 2-methoxyethanol, 2-methoxypropanol, 1-methoxy-2-propanol, toluene, xylene and dimethylformamide. A single organic solvent may be used alone, or a combination of two or more organic solvents may be used. When impregnation of the resin composition into the substrate is particularly important, the use of a combination of two or more organic solvents having boiling points of approximately 120 to 200° C. is preferred. The amount of the organic solvent is preferably equivalent to approximately 10 to 50% by mass of the entire resin composition including the organic solvent.

[Substrate]

The substrate used for the prepreg of the present invention may be any of the conventional substrates used in the various types of printed wiring board materials, and examples include substrates formed from quartz glass fibers; substrates formed from glass fibers other than quartz glass fibers, such as E glass fibers, D glass fibers, S glass fibers, NE glass fibers and T glass fibers; substrates formed from inorganic fibers other than glass fibers; substrates formed from organic fibers such as polyimides, polyamides and polyesters; and substrates formed from a combination of two or more of the above types of fiber. Examples of the form of the substrate include a woven fabric, non-woven fabric, roving, chopped-strand mat and surfacing mat. There are no particular limitations on the thickness of the substrate, and a thickness of approximately 0.01 to 0.3 mm is typically suitable. Among the above substrates, in terms of strength and water absorption, a substrate formed from a glass fiber other than quartz glass fiber or a substrate formed from quartz glass fiber is preferred.

[Prepreg]

A prepreg of the present invention can be prepared by impregnating an aforementioned substrate with the resin composition (A-stage resin composition) comprising the above components (a) to (d), as well as a curing agent and any other components as required, and then drying and B-staging the resin composition. The temperature during drying is, for example, within a range from 70 to 150° C., and the drying time is typically approximately 30 to 60 minutes.

[Metal-Clad Laminate]

A metal-clad laminate of the present invention can be produced by disposing a metal foil of copper or aluminum or the like on one surface or both surfaces of a single layer of the above prepreg, or a plurality of laminated layers of the above prepreg, and then performing laminate molding. There are no particular limitations on the metal foil used, provided it is the type of foil used as a printed wiring board material. The method and conditions used for the laminate molding may employ the types of methods and conditions used in the production of laminates and multilayer boards used for conventional printed wiring boards. For example, a multi-daylight press, a multi-daylight vacuum press, a continuous molding apparatus or an autoclave molding apparatus or the like is used, and molding is generally performed under conditions including a temperature of 150 to 300° C., a pressure of 2 to 100 kgf/cm², and a heating time of 0.05 to 5 hours.

[Printed Wiring Board]

A printed wiring board of the present invention can be produced by removing the unnecessary portions of the metal foil from the aforementioned metal-clad laminate by etching, thereby forming a wiring pattern (circuit).

In the production of the aforementioned prepreg, laminate and printed wiring board, typical coating steps, lamination steps and circuit processing steps from the technical field may be implemented as required. The laminate and the printed wiring board obtained in this manner exhibit excellent heat resistance, flame retardancy and reliability.

[Semiconductor Device]

A semiconductor device of the present invention can be obtained by bonding a semiconductor element to the printed wiring board described above, connecting the wiring pattern of the printed wiring board to the semiconductor element with Cu wire, and if necessary, subsequently protecting a portion or all of the semiconductor element, the Cu wire and the printed wiring board by encapsulation with an encapsulating resin.

EXAMPLES

The present invention is described below in further detail based on a series of examples and comparative examples, but the present invention is in no way limited by these examples.

In the examples and comparative examples, the materials listed below were used as the thermosetting resin, the hydrotalcite compound, the zinc molybdate, the lanthanum oxide, and the other components.

Epoxy resin A: cresol novolac epoxy resin, manufactured by DIC Corporation, product name: N-673 (epoxy equivalent weight: 210)

Epoxy resin B: biphenyl aralkyl epoxy resin, manufactured by Nippon Kayaku Co., Ltd., product name: NC-3000H (epoxy equivalent weight: 292)

Bismaleimide: bis(3-ethyl-5-methyl-4-maleimidophenyl)methane, manufactured by KI Chemical Industry Co., Ltd., product name: BMI-70

Cyanate ester compound: 2,2-bis(4-cyanatophenyl)propane, manufactured by Huntsman International LLC, product name: AroCy-L-10

Phenol-based curing agent: phenol novolac resin, manufactured by DIC Corporation, product name: TD-2131

Amine-based curing agent: dicyandiamide, manufactured by Nippon Carbide Industries Co., Inc.

Zinc molybdate: manufactured by Nihon Sherwin Williams Co., Ltd., product name: Kemgard 911B Hydrotalcite compound: $Mg_{4.5}Al_2(OH)_{13}CO_3 \cdot 3.5H_2O$, manufactured by Kyowa Chemical Industry Co., Ltd., product name: DHT-4A-2

Lanthanum oxide: manufactured by Shin-Etsu Chemical Co., Ltd.

Triphenylphosphine: manufactured by Hokko Chemical Industry Co., Ltd., product name: TPP 2-ethyl-4-methylimidazole: manufactured by Shikoku Chemicals Corporation, product name: 2E4MZ Zinc octoate: (reagent grade)

Aluminum hydroxide: manufactured by Sumitomo Chemical Co., Ltd., product name: CL-303

Silica: manufactured by Admatechs Co., Ltd., product name: SC-2500SQ

Example 1

Preparation of Prepreg, Copper-Clad Laminate, and Printed Wiring Board

A resin varnish having the composition described below was prepared, and the varnish was impregnated into an E glass woven fabric having a thickness of 0.1 mm and heated at 160° C. for 5 minutes, yielding a prepreg in which the resin varnish in a semi-cured state was impregnated within the E glass woven fabric.

Epoxy resin A: 60 parts by mass
Phenol-based curing agent: 40 parts by mass
Hydrotalcite compound: 3 parts by mass
Zinc molybdate: 10 parts by mass
Lanthanum oxide: 0.5 parts by mass
Silica: 80 parts by mass
Triphenylphosphine: 2 parts by mass
Solvent (methyl ethyl ketone): 300 parts by mass Subsequently, 4 sheets of the prepreg were stacked on top of each other, an electrolytic copper foil having a thickness of 18 μm was disposed on both surfaces of the stacked structure, and the structure was pressed at 180° C. for 90 minutes under a pressure of 3 MPa, yielding a double-sided copper-clad laminate having a thickness of 0.4 mm. Unnecessary portions of the copper foil were removed from this copper-clad laminate by etching, thus forming circuits on both surfaces. Through-holes were then opened within circuit portions of the laminate, and the interiors of the through-holes were plated, thereby electrically connecting the circuits on both sides of the laminate.

A solder resist (product name: PSR-4000 AUS-308, manufactured by Taiyo Ink Mfg. Co., Ltd.) having a thickness of 25 μm was applied across the entire surface of the laminate, and preliminary drying was performed by heating at 80° C. for 30 minutes. Next, UV light was irradiated onto the laminate through a negative film, so that the solder resist remained in an uncured state in those portions that required soldering, while the solder resist applied to those portions that required protection was cured. The uncured portions of the solder resist were then removed by a developing solution, and the exposed copper foil portions were subjected to metal plating, thus forming a BGA printed wiring board.

<Measurement of pH and Impurity Concentration Levels of Water Extract of Printed Wiring Board>

The printed wiring board was extracted with water at 160° C. for 20 hours, and the pH and impurity concentration levels of the water extract were measured.

<Preparation of Semiconductor Device>

Subsequently, a semiconductor element for testing and evaluation purposes (10 mm×10 mm×0.3 mm), comprising Al wiring with a width of 5 μm disposed with a 5 inn spacing between wires, was bonded to the above printed wiring board using a die-attach film (product name: X-45-3024DT3, manufactured by Shin-Etsu Chemical Co., Ltd., thickness: 25 μm) under conditions including a temperature of 130° C. and a pressure of 0.5 MPa, and the structure was then heated at 175° C. for 2 hours to cure the die-attach film.

The Al pads on the semiconductor element and the metal-plated portions on the printed wiring board were connected using Cu wire having a diameter of 2 μm and a length of 3.5 mm. Subsequently, transfer molding was performed at 175° C. for 90 seconds at a pressure of 6.9 MPa to encapsulate the entire structure including the semiconductor element, the printed wiring board and the Cu wire within a halogen-free epoxy resin (product name: KMC-6000NHR-1, manufactured by Shin-Etsu Chemical Co., Ltd.). Post-mold curing (PMC) was then performed at 180° C. for 4 hours, yielding a semiconductor device having dimensions of 24 mm×24 mm×1.2 mm.

<Moisture-Resistant Reliability Test>

The prepared semiconductor device was held at 121° C. under 2 atmospheres for 300 hours, a 10 V bias was then applied, and the rate of open failures was measured.

<MSL Test>

The prepared semiconductor device was stored for 192 hours under conditions including a temperature of 30° C. and 70% RH, and was subsequently passed through an IR reflow oven having a maximum temperature of 260° C. An ultrasonic test device was then used to confirm the existence or absence of peeling within the interior of the semiconductor device.

Example 2

With the exception of altering the composition of the resin varnish described in example 1 to the composition described below, a printed wiring board and a semiconductor device were prepared and evaluated in the same manner as example 1.

Epoxy resin A: 100 parts by mass
Amine-based curing agent: 4 parts by mass
Hydrotalcite compound: 3 parts by mass
Zinc molybdate: 10 parts by mass
Lanthanum oxide: 0.5 parts by mass
Silica: 80 parts by mass
2-ethyl-4-methylimidazole: 0.3 parts by mass
Solvent (methyl ethyl ketone): 300 parts by mass Example 3

With the exception of altering the composition of the resin varnish described in example 1 to the composition described below, a printed wiring board and a semiconductor device were prepared and evaluated in the same manner as example 1.

Epoxy resin A: 60 parts by mass
Phenol-based curing agent: 40 parts by mass
Hydrotalcite compound: 3 parts by mass
Zinc molybdate: 10 parts by mass
Lanthanum oxide: 0.5 parts by mass
Aluminum hydroxide: 40 parts by mass
Silica: 40 parts by mass
Triphenylphosphine: 2 parts by mass
Solvent (methyl ethyl ketone): 300 parts by mass Example 4

With the exception of altering the composition of the resin varnish described in example 1 to the composition described below, a printed wiring board and a semiconductor device were prepared and evaluated in the same manner as example 1.

Bismaleimide: 70 parts by mass
Cyanate ester compound: 30 parts by mass
Hydrotalcite compound: 3 parts by mass
Zinc molybdate: 10 parts by mass
Lanthanum oxide: 0.5 parts by mass
Silica: 80 parts by mass
Zinc octoate: 0.01 parts by mass
Solvent (methyl ethyl ketone): 300 parts by mass Comparative Example 1

With the exception of altering the composition of the resin varnish described in example 1 to the composition described below, a printed wiring board and a semiconductor device were prepared and evaluated in the same manner as example 1.

Epoxy resin A: 60 parts by mass
Phenol-based curing agent: 40 parts by mass
Silica: 80 parts by mass
Triphenylphosphine: 2 parts by mass
Solvent (methyl ethyl ketone): 300 parts by mass Comparative Example 2

With the exception of altering the composition of the resin varnish described in example 1 to the composition described below, a printed wiring board and a semiconductor device were prepared and evaluated in the same manner as example 1.

Epoxy resin A: 100 parts by mass
Amine-based curing agent: 4 parts by mass
Silica: 80 parts by mass
2-ethyl-4-methylimidazole: 0.3 parts by mass
Solvent (methyl ethyl ketone): 300 parts by mass Comparative Example 3

With the exception of altering the composition of the resin varnish described in example 1 to the composition described below, a printed wiring board and a semiconductor device were prepared and evaluated in the same manner as example 1.

Epoxy resin A: 100 parts by mass
Amine-based curing agent: 4 parts by mass
Hydrotalcite compound: 7 parts by mass
Zinc molybdate: 10 parts by mass
Lanthanum oxide: 3 parts by mass
Silica: 80 parts by mass
2-ethyl-4-methylimidazole: 0.3 parts by mass
Solvent (methyl ethyl ketone): 300 parts by mass Comparative Example 4

With the exception of altering the composition of the resin varnish described in example 1 to the composition described below, a printed wiring board and a semiconductor device were prepared and evaluated in the same manner as example 1.

Bismaleimide: 70 parts by mass
Cyanate ester compound: 30 parts by mass
Silica: 80 parts by mass
Zinc octoate: 0.01 parts by mass
Solvent (methyl ethyl ketone): 300 parts by mass The results of the tests are shown in Table 1 and Table 2.

TABLE 1

| | Example | 1 | 2 | 3 | 4 |
|---|---|---|---|---|---|
| pH and impurity concentration levels of water extract of printed wiring board | pH | 5.5 | 5.9 | 6.1 | 5.6 |
| | Cl$^-$ ion (ppm) | 5 | 12 | 7 | 4 |
| | Phosphate ion (ppm) | <2 | <2 | <2 | <2 |
| | Sulfate ion (ppm) | <2 | <2 | <2 | <2 |

TABLE 1-continued

| Example | | | 1 | 2 | 3 | 4 |
|---|---|---|---|---|---|---|
| | | Acetate ion (ppm) | 40 | 40 | 45 | 30 |
| Semi-conductor device | Heat-resistant and moisture-resistant reliability test | Open failure rate | 0/24 | 0/24 | 0/24 | 0/24 |
| | MSL test | Rate of peeling | 0/24 | 0/24 | 0/24 | 0/24 |

TABLE 2

| Comparative Example | | | 1 | 2 | 3 | 4 |
|---|---|---|---|---|---|---|
| pH and impurity concentration levels of water extract of printed wiring board | | pH | 4.0 | 4.8 | 6 | 4.3 |
| | | Cl⁻ ion (ppm) | 25 | 55 | 10 | 24 |
| | | Phosphate ion (ppm) | 15 | 18 | <2 | 20 |
| | | Sulfate ion (ppm) | 20 | 28 | <2 | 25 |
| | | Acetate ion (ppm) | 300 | 380 | 40 | 400 |
| Semi-conductor device | Heat-resistant and moisture-resistant reliability test | Open failure rate | 11/24 | 15/24 | 0/24 | 13/24 |
| | MSL test | Rate of peeling | 0/24 | 0/24 | 6/24 | 0/24 |

Based on the above results, it is evident that in the semiconductor devices that used the prepreg of the present invention, the generation of impurities under conditions of high temperature and high humidity was able to be inhibited. Accordingly, the prepreg of the present invention is effective in improving the reliability of semiconductor devices that use Cu wire.

What is claimed is:

1. A prepreg comprising a substrate and a B-staged resin composition comprising:
   (a) 100 parts by mass of a thermosetting resin,
   (b) 1 to 5 parts by mass of a hydrotalcite compound represented by formula (1) shown below:

$$Mg_xAl_y(OH)_{2x+3y-2z}(CO_3)_z \cdot mH_2O \qquad (1)$$

wherein x and y are positive numbers, and z represents 0 or a positive number, provided that x, y and z satisfy $0<y/x\leq1$ and $0\leq z/y<1.5$, and m represents a positive number,
   (c) at least 0.5 parts by mass of zinc molybdate, and
   (d) 0.2 to 1 part by mass of lanthanum oxide,
wherein the resin composition is impregnated into the substrate.

2. A metal-clad laminate comprising:
   one layer of, or a plurality of laminated layers of, the prepreg defined in claim 1, and
   a metal foil provided on one surface or both surfaces of the prepreg.

3. A printed wiring board comprising:
   one layer of, or a plurality of laminated layers of, the prepreg defined in claim 1, and
   a wiring pattern composed of a metal foil, provided on one surface or both surfaces of the prepreg.

4. A semiconductor device comprising:
   the printed wiring board defined in claim 3,
   a semiconductor element mounted on the printed wiring board, and
   Cu wire that electrically connects a wiring pattern of the printed wiring board and the semiconductor element.

* * * * *